(12) United States Patent
Hasegawa (10) Patent No.: US 7,907,251 B2
(45) Date of Patent: Mar. 15, 2011

(54) EXPOSURE APPARATUS AND DEVICE MANUFACTURING METHOD

(75) Inventor: Noriyasu Hasegawa, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 412 days.

(21) Appl. No.: 11/994,240

(22) PCT Filed: Oct. 17, 2006

(86) PCT No.: PCT/JP2006/321001
§ 371 (c)(1),
(2), (4) Date: Dec. 28, 2007

(87) PCT Pub. No.: WO2007/046523
PCT Pub. Date: Apr. 26, 2007

(65) Prior Publication Data
US 2009/0122283 A1   May 14, 2009

(30) Foreign Application Priority Data

Oct. 18, 2005 (JP) ................................ 2005-302577
Aug. 10, 2006 (JP) ................................ 2006-219032

(51) Int. Cl.
*G03B 27/52* (2006.01)
*G03B 27/42* (2006.01)
(52) U.S. Cl. ............................................ 355/30; 355/53
(58) Field of Classification Search .................... 355/30, 355/53
See application file for complete search history.

(56) References Cited

U.S. PATENT DOCUMENTS

2005/0018155 A1* 1/2005 Cox et al. ......................... 355/30
2007/0070316 A1* 3/2007 Ehrmann et al. ................. 355/53

FOREIGN PATENT DOCUMENTS

| JP | 2004-289126 | 10/2004 |
| JP | 2005-136413 | 5/2005 |
| JP | 2005-183744 | 7/2005 |
| WO | WO 99/49504 | 9/1999 |
| WO | WO 2004/055803 | 7/2004 |
| WO | WO 2004/086470 | 10/2004 |
| WO | WO 2004/093159 | 10/2004 |
| WO | WO 2006/101120 | 9/2006 |

OTHER PUBLICATIONS

International Search Report issued on Dec. 12, 2006 for International Application No. PCT/JP2006/321001.

* cited by examiner

*Primary Examiner* — Peter B Kim
(74) *Attorney, Agent, or Firm* — Rossi, Kimms & McDowell LLP (57) ABSTRACT

An exposure apparatus (1) has a projection optical system (30) for projecting a pattern of a reticle onto a substrate, and exposes the substrate (40) via a liquid supplied in a space between the projection optical system (30) and the substrate (40). The exposure apparatus includes a gas curtain producer having two gas supply ports (103*a*, 103*b*) for supplying a gas to a circumference of the liquid and for limiting the liquid, the two gas supply ports (103*a*, 103*b*) supplying different types of gases (PG1, PG2).

12 Claims, 7 Drawing Sheets

EXPOSURE APPARATUS AND DEVICE MANUFACTURING METHOD

TECHNICAL FIELD

The present invention relates generally to an exposure apparatus, and more particularly to an exposure apparatus that exposes a substrate, such as a wafer for a semiconductor device, and a glass plate for a liquid crystal display device. The present invention is suitable, for example, for a so-called immersion exposure apparatus that fills a liquid in a space between a final lens of the projection optical system and the substrate, and exposes the substrate through the liquid.

BACKGROUND ART

A projection exposure apparatus has been conventionally used to project a circuit pattern of a reticle (or a mask) via a projection optical system onto a wafer etc, and high-resolution and high-throughput exposures have recently been increasingly demanded. The immersion exposure has attracted people's attentions as one means that meets the high-resolution demand. The immersion exposure promotes a higher numerical aperture ("NA") of the projection optical system by replacing a medium at the wafer side of the projection optical system with a liquid. The projection optical system has an NA=n· sin θ where n is a refractive index of the medium, and the NA increases up to n when the medium that has a refractive index higher than that of air, i.e., n>1. As a result, the resolution R (R=$k_1$(λ/NA)) of the exposure apparatus expressed by a process constant $k_1$ and a light source wavelength λ becomes small.

A local fill that locally fills a liquid in a space between the projection optical system and the wafer is proposed in the immersion exposure. See, for example, International Publications Nos. 99/49504 and 2004/086470. An gas curtain system is also proposed which blows a gas against the interface of the liquid that has been supplied between the projection optical system and the wafer, and limits the liquid between them. See, for example, Japanese Patent Application, Publication No. 2004-289126.

However, in Japanese Patent Application No. 2004-289126, the gas pressure of the gas curtain that limits the liquid between the projection optical system and the wafer so weak that the filled liquid disperses as the wafer moves at a high speed during exposure.

Insufficient filling of the liquid would cause a mixture of gas bubbles in the liquid. The gas bubbles mixed in the liquid diffusely reflect the exposure light, and reduce the exposure dose and thus the throughput. When the gas curtain around the liquid has a low humidity, the liquid evaporates and causes the evaporation heat. Due to this evaporation heat, not only the liquid cools but also the projection optical system and wafer that contact the liquid cool, causing their deformations and lowered exposure accuracy. In addition, it is not always economical to create the gas curtain throughout the contour of the liquid.

DISCLOSURE OF INVENTION

The present invention is directed to an exposure apparatus that has a high throughput, exposure accuracy, and economical efficiency.

An exposure apparatus according to one aspect of the present invention includes a projection optical system for projecting a pattern of a reticle onto a substrate, the exposure apparatus exposing the substrate via a liquid supplied in a space between the projection optical system and the substrate, and a gas curtain producer having two gas supply ports for supplying a gas to a circumference of the liquid and for restraining a spread of the liquid, the two gas supply ports supplying different types of gases.

Other objects and further features of the present invention will become readily apparent from the following description of the embodiments with reference to accompanying drawings.

BEST MODE FOR CARRYING OUT THE INVENTION

Figure 1:
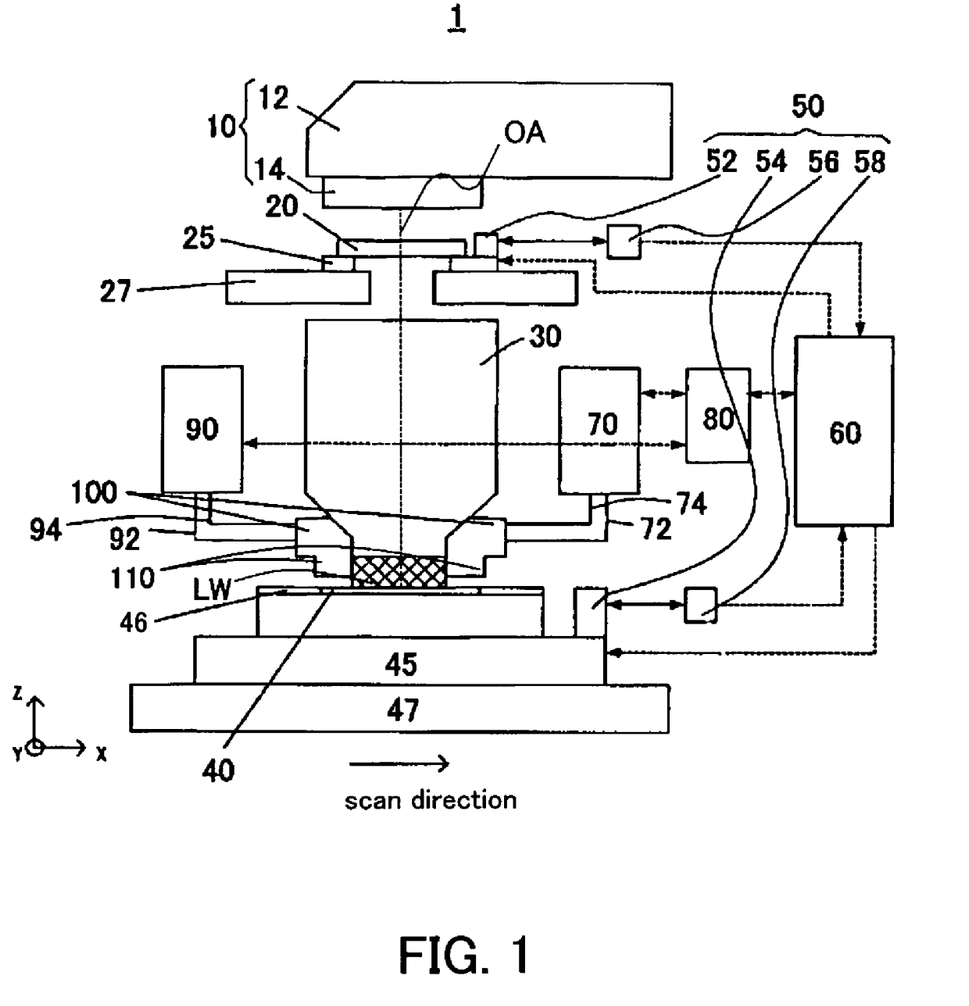
FIG. 1 is a schematic view of a structure of an exposure apparatus according to one aspect of the present invention.

Referring now to the accompanying drawings, a description will be given of an exposure apparatus 1 according to one aspect of the present invention. Here, FIG. 1 is a schematic block diagram of a structure of the inventive exposure apparatus 1. The exposure apparatus 1 is an immersion exposure apparatus that exposes a pattern of a reticle 20 onto a wafer 40 via a liquid LW supplied in a space between the wafer 40 and a final lens or surface of a projection optical system 30 closest to the wafer 40. While the exposure apparatus 1 of this embodiment is an exposure apparatus in a step-and-scan manner, the present invention is applicable to a step-and-repeat manner and other exposure methods.

The exposure apparatus 1 includes an illumination apparatus 10, a reticle stage 25, a projection optical system 30, a wafer stage 45, a distance-measuring apparatus 50, a stage controller 60, a liquid supply/recovery mechanism 70, an immersion controller 80, a gas supply/recovery mechanism 90, and a nozzle unit 100.

The illumination apparatus 10 illuminates the reticle 20 that has a circuit pattern to be transferred. The illumination apparatus 10 includes a light source section 12, and an illumination optical system 14.

The light source section 12 of this embodiment is an ArF excimer laser with a wavelength of approximately 193 nm as a light source. However, the light source section 12 is not limited to the ArF excimer laser, and may use a KrF excimer laser with a wavelength of approximately 248 nm, and a $F_2$ laser with a wavelength of approximately 157 nm, etc.

The illumination optical system 14 is an optical system that illuminates the reticle 20, and includes a lens, a mirror, an optical integrator, a stop, etc.

The reticle 20 is supported and driven by the reticle stage 25. The reticle 20 is made, for example, of quartz, and has a circuit pattern to be transferred. The diffracted light from the reticle 20 passes the projection optical system 30, and then is projected onto the wafer 40. The reticle 20 and the wafer 40 are located in an optically conjugate relationship. The exposure apparatus 1 is of a step-and-scan manner, and therefore, scans the reticle 20 and the wafer 40 at a speed ratio corresponding to a reduction ratio in transferring the pattern on the reticle 20 onto the wafer 40.

The reticle stage 25 is fixed on a stool 27. The reticle stage 25 mounts or supports the reticle 20, and its movement is controlled by a transport mechanism (not shown) and the stage controller 60. The transport mechanism (not shown) includes a linear motor, etc., and moves the reticle stage 25 in a scan direction (or an X-axis direction in this embodiment), thereby moving the reticle 20.

The projection optical system 30 projects a pattern of the reticle 20 onto the wafer 40. The projection optical system 30 may use a dioptric optical system solely composed of a plurality of lens elements, a catoptric optical system composed of a plurality of lens elements and at least one concave mirror (a catadioptric optical system), etc.

The wafer 40 is supported and driven by the wafer stage 45. The wafer 40 is one illustrative substrate to be exposed, and broadly covers a glass plate and another substrate to be exposed. A photoresist is applied onto the wafer 40.

The wafer 40 is fixed onto a stool 47, and mounts or supports the wafer 40. The wafer stage 45 serves to adjust a longitudinal or vertical position (in the Z-axis direction), a rotating direction, and an inclination of the wafer 40, and is controlled by the stage controller 60.

The wafer stage 45 is provided with a flat-topped plate 46, which is a plate that maintains flat the top surface of the wafer 40 on the wafer stage 45 and the top surface of the area outside the wafer 40, and is approximately level with the wafer 40. The flat-topped plate 46 enables a liquid film to be formed outside the wafer 40 or to hold the liquid LW in exposing the edge shot.

The distance-measuring apparatus 50 uses reference mirrors 52 and 54, and laser interferometers 56 and 58 to measure two-dimensional positions of the reticle stage 25 and the wafer stage 45 on the real time basis. The distance-measuring apparatus 50 transmits a distance measurement result to the stage controller 60.

The stage controller 60 controls driving of the reticle stage 25 and the wafer stage 45. The stage controller 60 drives the reticle stage 25 and the wafer stage 45 at a constant speed ratio based on a distance measurement result of the distance-measuring apparatus 50. The stage controller 60 controls the wafer stage 45, for example, so that the surface of the wafer 40 precisely accords with a focal or imaging plane of the projection optical system 30 during exposure.

A liquid supply/recovery mechanism 70 supplies the liquid LW to the space between the projection optical system 30 and the wafer 40 via a liquid supply pipe 72, and recovers the liquid LW from the space between them via a liquid recovery pipe 74. The liquid LW is selected from a material that is little absorbed in the exposure light, and preferably has almost the same refractive index as a dioptric optical element such as quartz and the calcium fluoride. For example, the liquid LW uses pure water, functional water, and fluoride liquid, such as fluorocarbon.

It is desirable to previously remove a dissolved gas sufficiently from the liquid LW by a deaerator (not shown), thereby restraining generations of the air bubbles, and enabling the air bubbles to be absorbed into the liquid as soon as they occur. For example, for nitrogen and the oxygen in air, a removal of 80% or more of the dissolvable gas amount in the liquid LW can sufficiently restrain generations of the air bubbles. The liquid supply/recovery mechanism 70 (exposure apparatus 1) may be provided with the deaerator (not shown) so as to supply the liquid LW while always removing the dissolved gas from the liquid LW. For example, one suitable deaerator is a vacuum deaerator that flows the liquid LW into one side separated by a gas transmission film, makes the other side vacuum, and drives out the dissolved gas in the liquid LW in the vacuum through the film. In general, the liquid supply/recovery mechanism 70 includes a tank that stores the liquid LW, a purifier that purifies the liquid LW, a pressure feeder that feeds out the liquid LW, a controller that controls a flow and temperature of the liquid LW, and a suction apparatus that sucks the liquid LW.

The liquid supply pipe 72 is arranged around the final plane or lens of the projection optical system 30, and connected to a liquid supply port 101 formed in the nozzle unit 100. Thereby, the liquid supply pipe 72 supplies the liquid to the space between the projection optical system 30 and the wafer 40, and forms a film of the liquid LW. An interval between the projection optical system 30 and the wafer 40 is preferably set enough to stably form a film of the liquid LW, such as 1.0 mm.

The liquid supply pipe 72 is preferably made of a material that causes little elution or less contaminates the liquid LW, such as Teflon resin, polyethylene resin, and polypropylene resin. In particular, when the liquid LW uses a liquid other than pure water, the liquid supply pipe 72 is made of a material that causes little dissolved material and has a resistance to the liquid LW.

The liquid recovery pipe 74 is arranged around the liquid supply pipe 72, and connected to a liquid recovery port 102 formed in the nozzle unit 100. Similar to the liquid supply pipe 72, the liquid recovery pipe 74 is made of a material that causes little elution or less contaminates the liquid LW, and has a resistance to the liquid LW.

The immersion controller 80 obtains information of the wafer stage 45 from the stage controller 60, such as a current position, a speed, acceleration, a target position, and a moving direction, and controls the liquid supply/recovery mechanism 70 based on the information. More specifically, the immersion controller 80 controls switching and stopping of supply/recovery of the liquid LW, and the supply and recovery amounts of the liquid LW.

The gas supply/recovery mechanism (gas curtain producer) 90 supplies or blows a gas PG to or against at least part of the circumference of the liquid LW that has been supplied to the space between the projection optical system 30 and the wafer 40, via a gas supply pipe 92, and recovers the supplied gas PG via a gas recovery pipe 94. In other words, the gas supply/recovery mechanism 90 supplies the gas PG to or blows the gas PG against at least part of the circumference of the liquid LW, and forms a gas curtain that restrains a spread of the liquid LW or limits the liquid LW. The gas curtain restrains a contact between the liquid LW and the external circumstance. The gas supply/recovery mechanism 90 of this embodiment supplies two different types of gases PG, i.e., a first gas PG1 and a second gas PG2, in cooperation with a gas adjuster 96, which will be described later. Of course, the present invention allows the gas supply/recovery mechanism 90 to supply two different types of gases without intervening the gas adjuster 96.

Figure 2:
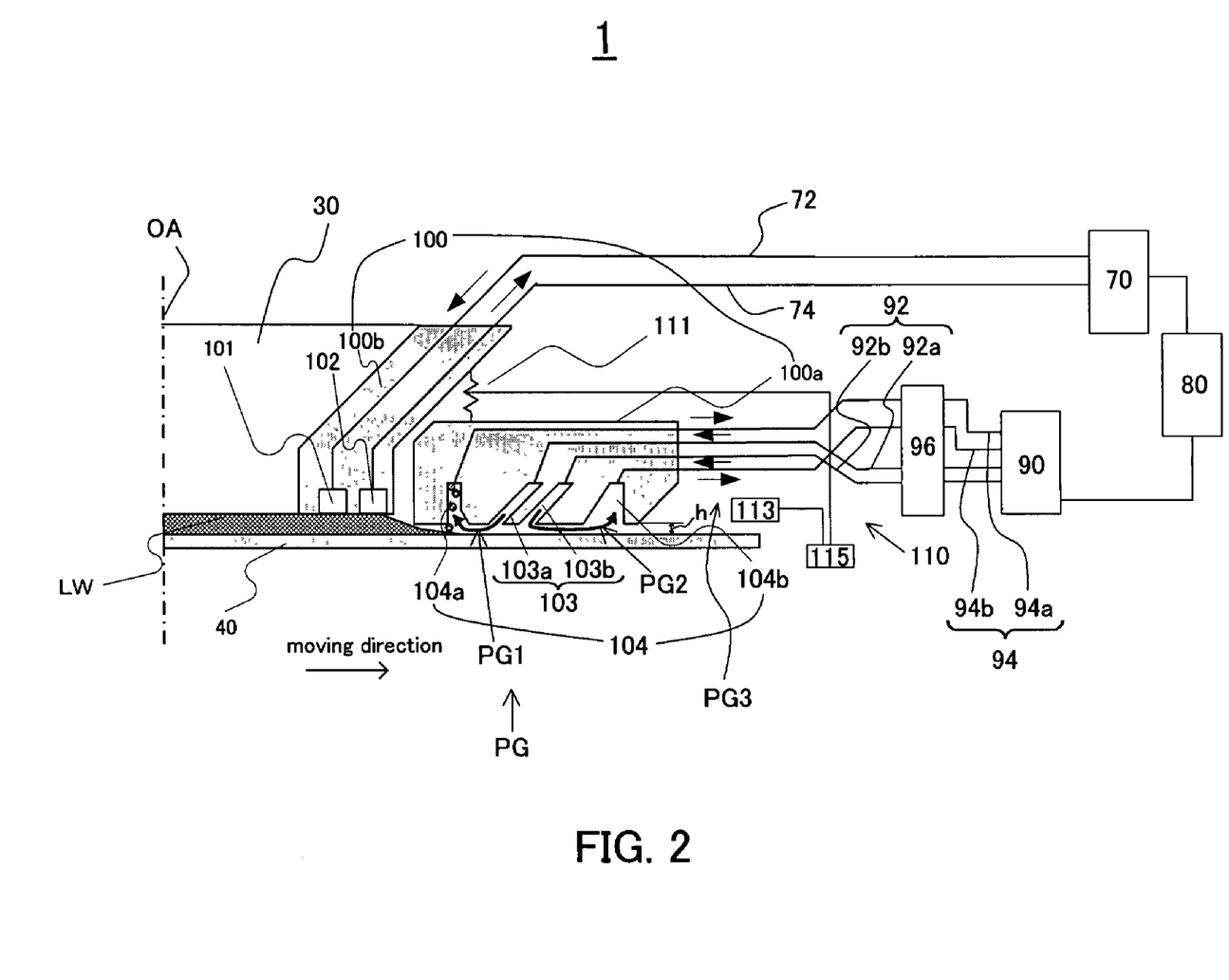
FIG. 2 is an enlarged sectional view near a projection optical system and a wafer in the exposure apparatus shown in FIG. 1.

The gas supply pipe 92 is made of resin or metal, such as stainless steel, and connected to the gas supply port 103 in the nozzle unit 100, as shown in FIG. 2. The gas supply pipe 92 of this embodiment includes two gas supply pipes 92a and 92b. The gas supply pipe 92a is connected to the first gas supply port 103a, and the gas supply pipe 92b is connected to the second gas supply port 103b. The gas supply pipe 92a supplies the first gas PG1 via the first gas supply port 103a, and the gas supply pipe 92b supplies the second gas PG2 via the second gas supply port 103b.

The gas recovery pipe 94 is made of resin or steel similar to the gas supply pipe 92, and connected to the gas recovery port 104 formed in the nozzle unit 100. The gas recovery pipe 94 in this embodiment includes two gas recovery pipe 94a and 94b. The gas recovery pipe 94a is connected to the first gas recovery port 104a, and the gas recovery pipe 94b is connected to the second gas recovery port 104b. The gas recovery pipe 94a recovers the first gas PG1 via the first gas recovery port 104a, and the gas recovery pipe 94b recovers the second gas PG2 via the second gas recovery port 104b.

The gas adjuster 96 serves to adjust the temperature and humidity of the gas PG (or the concentration of the liquid LW contained in the gas PG), and generates two different types of gasses, i.e., the first gas PG1 and the second gas PG2. The gas adjuster 96 supplies the first gas PG1 to the gas supply pipe 92a (first gas supply port 103a), and the second gas PG2 different from the first gas PG1 to the gas supply pipe 92b (second gas supply port 103b). The two different types of gasses are, for example, airs having different humidities from each other. In that case, the gas adjuster 96 adjusts, for example, so that the humidity of the first gas PG1 is higher than the humidity of the second gas PG2. In addition, two different types of gasses may be air and inert gas. For example, the first gas PG1 uses gas that is a mixture of inert gas, such as nitrogen, helium, neon, and argon, or hydrogen and vapor of the liquid LW, whereas the second gas PG2 uses air. The first gas PG1 contacts the liquid LW, as described later, and can shield oxygen that decreases the transmittance of the exposure light from the liquid LW, when the first gas PG1 uses inert gas that has a small partial pressure of oxygen. In addition, the inert gas exhibits little deteriorations of transfer characteristic, because even if the inert gas is dissolved in the liquid LW, the refractive index change of the liquid LW is small. The gas adjuster 96 has a humidity (concentration) measurement part (not shown), and a temperature measurement part (not shown). The humidity measurement part measures the humidity of the gas PG (or concentration of the vapor of the same material as the liquid LW contained in the gas PG or the vapor having the same composition as the vapor of the evaporating liquid LW). The temperature measurement part measures the temperature of the gas PG.

In this embodiment, as shown in FIG. 2, the first gas PG1 supplied from the first gas supply port 103a and the second gas PG2 supplied from the second gas supply port 103b form two or double gas curtains. The gas curtain formed by the second gas PG2 is arranged outer than that formed by the first gas PG1 with respect to the optical axis OA of the projection optical system 30. In this embodiment, the term "inner" is defined as a side approaching to the optical axis OA of the projection optical system 30 (or the optical axis OA side), and the term "outer" is defined as a side separating from the optical axis OA of the projection optical system 30.

The first gas PG1 forms the gas curtain around the liquid LW, and contacts the liquid LW. When the humidity of the first gas PG1 is low, the liquid LW evaporates and causes the evaporation heat. Due to The evaporation heat, not only the temperature of the liquid LW lowers but also the temperatures of (the final lens in) the projection optical system 30 and (the surface of) the wafer 40 lower. This causes deformations of the final lens in the projection optical system 30 and the surface of the wafer 40, and deteriorates the exposure accuracy due to a generation of the aberration and a change of a focal (imaging) position. Accordingly, the gas adjuster 96 of this embodiment adjusts so that the humidity of the first gas PG1 is higher than that of the second gas PG2. More specifically, the gas adjuster 96 mixes the vapor of the same material as the liquid LW or the vapor having the same composition as the evaporating liquid LW into the first gas PG1. The first gas PG1 having a higher humidity than that of the second gas PG2 can restrain an evaporation of the liquid LW.

Without forming the gas curtain by the second gas PG2, it is conceivable to form a gas curtain of only the first gas PG1. The second gas PG2 gives three effects:

The first effect is to supplement a formation of the gas curtain by the first gas PG1 through a formation of the gas curtain of the second gas PG2 (rectifying action). When the gas curtain of only the first gas PG1 is formed (or when the first gas PG1 is supplied), part of the first gas PG1 escapes from the first gas supply port 103a to the outside, and a gas pressure of the gas curtain that limits the liquid LW becomes weak. As a result, when the wafer 40 moves at a high speed during exposure, the liquid LW supplied or filled in a space between the projection optical system 30 and the wafer 40 disperses around the liquid LW. In addition, as in Japanese Patent Application, Publication No. 2004-289126, only one recovery port that recovers the gases from two gas supply ports cannot stabilize channels of these gases supplied from these gas supply ports and thus is not viable. This embodiment provides the gas curtain of the second gas PG2, and restrains the first gas PG1 from escaping from the first gas supply port 103a to the outside, making strong the gas curtain formed by the first gas PG1. More specifically, this embodiment arranges, as shown in FIG. 2, the first gas recovery port 104a, the first gas supply port 103a, the second gas supply port 103b, the second gas recovery port 104b in this order from the optical axis OA along the radial direction of the final lens of the projection optical system 30 (from the inner side to the outer side). With respect to the optical axis OA of the projection optical system 30, this configuration enables the first gas PG1 to move from the outer side to the inner side, and the second gas PG2 to move from the inner side to the outer side, providing the rectifying action. An arrangement among the first gas recovery port 104a, the first gas supply port 103a, the second gas supply port 103b, and the second gas recovery port 104b will be detailed later.

The second effect is to maintain low the humidity in the chamber of the exposure apparatus 1 through a formation of the gas curtain of the second gas PG2 (humidity control effect). When the first humid gas PG1 outflows from the outside of the convex 100a, which will be described later, mechanical and electrical components could erode in the space that accommodates the wafer stage 45. In addition, the concentration distribution in the atmosphere in the space that accommodates the wafer stage 45 become so uneven that the distance-measuring apparatus 50 that includes the laser interferometers 56 and 58 causes a high measurement error. Accordingly, the exposure apparatus 1 of this embodiment covers the first gas PG1 by the gas curtain of the second gas PG2, preventing outflows of the first humid gas PG1 from the convex 100a to the outside. In this case, the second gas PG2 is preferably adjusted to the humidity or composition similar to that of the gas or atmosphere in the space in which the wafer stage 45 is arranged.

The third effect is to simplify a chamber that encloses the exposure apparatus 1 (or the space in which the wafer stage 45 is arranged) through a formation of the gas curtain of the second gas PG2. When component ratios of the second gas PG2 and the atmosphere (gas) PG3 in the space in which the wafer stage 45 is arranged differ from that of the atmosphere PG4 in the clean room in which the exposure apparatus 1 is placed, a chamber that houses the exposure apparatus 1 needs to be strong. The strong chamber means a chamber with little gas movements between the inside of the chamber and the outside of the chamber. The strong chamber enlarges reflections of sounds generated from the air-conditioning fan and the driving mechanism in the chamber, thus increasing a measurement error of the distance-measuring apparatus 50 that includes the laser interferometers 56 and 58.

On the other hand, when the component ratio of the second gas PG2 is approximately the same as that of the atmosphere PG3 in the space in which the wafer stage 45 is arranged and that of the atmosphere PG4 of the clean room in which the exposure apparatus 1 is placed, a simple chamber is viable which is less expensive than the strong chamber. Accordingly, this embodiment forms a gas curtain using the second gas PG2 with a component ratio that is made approximately the same as that of the atmosphere PG3 of the space in which the wafer stage 45 is arranged and that of the atmosphere PG4 of the clean room in which the exposure apparatus 1 is placed. When the liquid LW uses pure water, the atmosphere of the clean room in which the exposure apparatus 1 is arranged is controlled to about 40%, and thus the humidity of the second gas PG2 is preferably about 40%.

The first effect (rectifying action) requires the first and second gases PG1 and PG2 to have different moving directions. The second effect (humidity control effect) requires the double gas curtains to be formed but the moving directions of the first and second gases PG1 and PG2 are of no concern.

A vapor mixture amount in the gas supply port 103 equal to the saturated vapor pressure causes dews on the surface of the wafer 40 due to the pressure/temperature drops when the gas PG gushes to the outside the gas supply port 103. As the dews on the surface of the wafer 40 would cause the evaporation heat during evaporations, the temperature drop of the wafer 40 deforms the wafer 40, deteriorating the exposure accuracy. In order to restrain the generation of the dews, it is preferable to maintain the humidity of the gas PG in the gas supply port 103 equal to or lower than that of the gas outside the gas supply port 103.

When the gas PG is supplied from the gas supply port 103, the pressure of the inside of the gas supply port 103 is higher than that of the outside of the gas supply port 103 due to the pressure loss of the channel. Moreover, the temperature lowers due to the adiabatic expansion when the gas PG gushes from the gas supply port 103. In order to control the temperature of the wafer 40 to a predetermined temperature, it is preferable to supply the gas PG at a temperature slightly higher than the predetermined temperature.

When the humidity of the gas PG is adjusted higher or when the leakage amount of the gas PG to the outside of the nozzle unit 100 (convex part 100a) is high, the concentration of the atmosphere in the space in which the wafer stage 45 is arranged becomes so uneven that the measurement apparatus 50 has a non-negligible measurement error, lowering the exposure accuracy. It is thus preferable to restrain the humid gas PG from leaking to the outside of the convex 100a by adjusting the supply amount of the gas PG supplied from the gas supply port 103 lower than the recovery amount recovered from the gas recovery port 104. This configuration stabilizes the concentration of the atmosphere in the space in which the wafer stage 45 is arranged, and reduces the measurement error of the distance-measuring apparatus 50.

Figure 3:
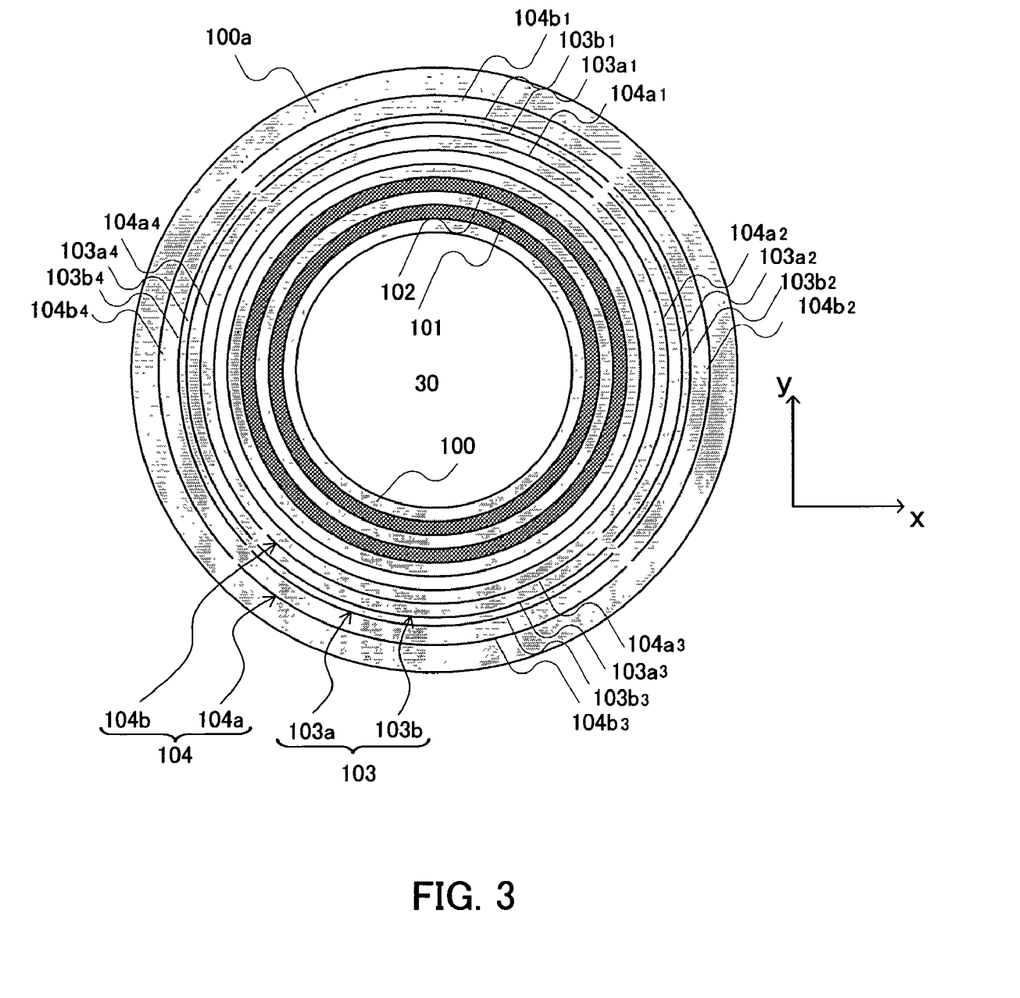
FIG. 3 is a schematic bottom view of a nozzle unit in the exposure apparatus shown in FIG. 1.

The nozzle unit 100 of this embodiment includes the convex 100a that has the gas supply port 103 and the gas recovery port 104, and a base 100b that has the liquid supply port 101 and the liquid recovery port 102. The liquid supply port 101, the liquid recovery port 102, the gas supply port 103, and the gas recovery port 104 are openings held between two concentric circles, as shown in FIG. 3, and may include a porous member, such as sponge, or be formed as a cavity. The liquid supply port 101, the liquid recovery port 102, the gas supply port 103, and the gas recovery port 104 may have a shape held two similar polygons or another shape in addition to a shape held between two concentric circles. Here, FIG. 3 is a schematic bottom view of the nozzle unit 100.

A detailed description will be given of an arrangement or positional relationship among the liquid supply port 101, the liquid recovery port 102, the gas supply port 103 (having a first gas supply port 103a and a second gas supply port 103b), and the gas recovery port 104 (having a first gas recovery port 104a and a second gas recovery port 104b).

Since the liquid supply port 101 is connected to the liquid supply pipe 72 and serves as an opening to supply the liquid LW, it is arranged closest to the projection optical system 30 among the liquid supply port 101, the liquid recovery port 102, the gas supply port 103, and the gas recovery port 104. The liquid recovery port 102 is connected to the liquid recovery pope 74 and serves as an opening to recover the supplied liquid LW, and is arranged near and outside the liquid supply port 101. While the liquid supply port 101 and the liquid recovery port 102 are concentric in this embodiment, they may be intermittently formed.

The liquid recovery port 102 sucks the gas around the liquid recovery port 102 together with the liquid LW. The fluid amount sucked from the liquid recovery port 102 is much higher than the liquid supply amount supplied from the liquid supply port 101. If an airtight bellows (not shown) connects the convex 100a and the base 100b of the nozzle 100 to each other, the atmospheric pressure around the liquid recovery port 102 becomes negative relative to the atmospheric pressure in the space outside the convex 100a. Thus, the interface of the liquid LW becomes unstable and gas bubbles are likely to occur, since the flow rate of the gas PG blown against the liquid LW exceeds several tens m/seconds via the space between the convex 100a and the wafer 40.

Accordingly, a gas supply/recovery pipes (not shown) is connected to the airtight bellows, and the gas is supplied and recovered so that the pressure in the gas supply/recovery pipes have the predetermined pressure, preventing the negative pressure in the space between the liquid recovery port 102 and the convex 100a. when supply gas supplied from the gas supply/recovery pipes is the same as the first gas PG1, the evaporation of the liquid LW further reduces. In addition, the negative pressure of the atmospheric pressure near the liquid recovery port 102 is also prevented by connecting an aperture between the base 100b and the convex 100a as a separate member to the external space of the nozzle unit 100.

The gas supply port 103 is connected to the gas supply pipe 92, and serves as an opening that supplies the first gas PG1 and the second gas PG2. The gas supply port 103 supplies the first gas PG1 and the second gas PG2 to form the gas curtain, and is formed in the convex 100a in this embodiment. The gas supply port 104 is connected to the gas recovery pipe 94, and serves as an opening that recovers the supplied first and second gases PG1 and PG2. The gas recovery port 104 is arranged near the gas supply port 103.

When the wafer stage 45 moves at a high speed, or when the contact angle of the liquid LW is low, the liquid LW is drawn and an extension amount of the liquid LW increases. The first gas PG1 supplied from the first gas supply port 103a restrains the extending liquid LW, and the first gas recovery port 104a recovers the extending liquid LW together with the first supplied gas PG1. In that case, the first gas recovery port 104a sucks air and liquid simultaneously, and would cause vibrations. Accordingly, this embodiment separates the convex 100a having the first gas recovery port 104a (including the second gas recovery port 104b) from the base 100b of the nozzle unit 100.

The first gas supply port 103a is arranged outside the liquid supply port 101 with respect to the optical axis OA of the projection optical system 30, and supplies the first gas PG1 around the liquid LW. The second gas supply port 103b is arranged outside the first gas supply port 103a with respect to the optical axis OA of the projection optical system 30, and supplies the second gas PG2 adjacent to the first gas PG1. The first gas recovery port 104a is arranged inside the first gas supply port 103a with respect to the optical axis OA of the projection optical system 30, and between the liquid supply port 101 and the first gas supply port 103a. The first gas recovery port 104a recovers at least the first gas PG1 supplied from the first gas supply port 103a. The second gas recovery port 104b is arranged outside the second gas supply port 103b with respect to the optical axis OA of the projection optical system 30, and recovers at least the second gas PG2.

When the first and second gas supply ports 103a and 103b supply the first gas PG1 and the second gas PG2 in order to form the double gas curtains around the liquid LW, the supply amounts and power consumption amounts of the first and second gas supply ports 103a and 103b increase. On the other hand, this inventor has discovered that the liquid LW moves in accordance with the moving direction of the wafer 40, and the liquid LW does not always spread in all the directions. Accordingly, this embodiment divides the gas supply port 103 and the gas recovery port 104 into four, respectively, as shown in FIG. 3, selects the gas supply port 103 and the gas recovery port 104 for use or driving in accordance with the spreading direction of the liquid LW, and for the gas curtain. Thus, this embodiment improves the economic efficiency of the exposure apparatus 1.

Figure 4:
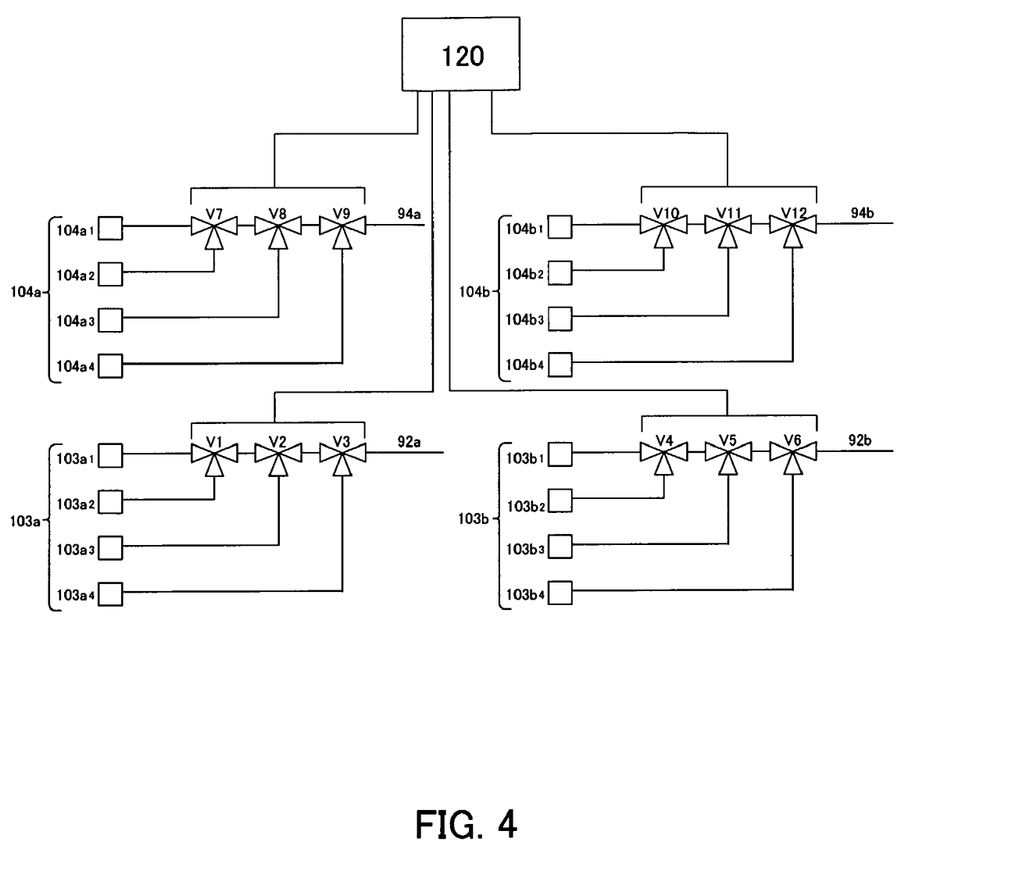
FIG. 4 is a schematic block diagram of structures of a gas supply port, a gas recovery port, valves, and a switch controller in the exposure apparatus shown in FIG. 1.

Referring now to FIGS. 3 and 4, a description will be given of a selection of the gas supply port 103 (having the first gas supply port 103a and the second gas supply port 103b) and the gas recovery port 104 (having the first gas recovery port 104a and the second gas recovery port 104b).

Referring to FIGS. 3 and 4, the first gas supply port 103a has first gas supply ports $103a_1$ to $103a_4$ that are switchable via valves V1, V2, and V3. The second gas supply port 103b has second gas supply ports $103b_1$ to $103b_4$ that are switchable via valves V4, V5, and V6. The first gas recovery port 104a has first gas recovery ports $104a_1$ to $104a_4$ that are switchable via valves V7, V8, and V9. The second gas recovery port 104b has second gas recovery ports $104b_1$ to $104b_4$ that are switchable via valves V10, V11, and V12. While this embodiment divides each of the first gas recovery port 104a and the second gas recovery port 104b into four, the present invention allows divisions into more sections. The switch controller 120 controls the valves V1 to V12. Here, FIG. 4 is a view for explaining a selection of each of the gas supply port 103 and the gas recovery port 104 in accordance with the spread of the liquid LW. FIG. 4 is a schematic block diagram of a structure of the gas supply port 103, the gas recovery port 104, the valves V1 to V12, and the switch controller 120.

The switch controller 120 controls or switches an action of each of the valves V1 to V12 in accordance with a moving direction of the wafer stage 45 (or the wafer 40) in order to save the consumption amounts of the first gas PG1 and the second gas PG2. In other words, the switch controller 120 selects a pair of the gas supply port and the gas recovery port for use among the plural gas supply ports and gas recovery ports based on the moving direction of the wafer stage 45. Referring to FIG. 3, when the wafer 40 moves in the +x direction, the liquid LW is drawn by the movement of the wafer 40 and extends in the +x direction. In this case, the first gas supply port $103a_2$ and the second gas supply port $103b_2$ supply the first gas PG1 and the second gas PG2, and the first gas recovery port $104a_2$ and the second gas recovery port $104b_2$ recover the first gas PG1 and the second gas PG2. This configuration restrains an extension of the liquid LW while restraining the consumption amount of the gas PG.

When the wafer 40 moves in the +x direction, the liquid LW should be limited in the moving direction of the wafer 40. Accordingly, supplies and recovery are stopped from the first gas supply port $103a_4$, the second gas supply port $103b_4$, the first gas recovery port $104a_4$, and the second gas recovery port $104b_4$. In addition, the gas PG is supplied and recovered from other gas supply ports and gas recovery ports so that the extension of the liquid LW can be restricted by restricting the consumption amounts of the first gas PG1 and the second gas PG2. In order to save the consumption amount of the first gas PG1 and the second gas PG2, the gas supply port may be switched but without switching the gas recovery port.

The liquid LW can use various types of materials, as described above, such as a material having a higher refractive index than pure water, organic or inorganic materials. It is feared that the evaporated material may contaminate the atmospheres of the inside and the outside of the exposure apparatus 1, fog up the optical elements to be used in the exposure apparatus, and erode the elements in the exposure apparatus. This embodiment decreases deformations of the interface of the liquid LW and the dispersion of the evaporated liquid LW to the convex 100a through the first gas supply port 103a, the second gas supply port 103b, the first gas recovery port 104a, and the second gas recovery port 104b. In this case, the first gas PG1 supplied from the first gas supply pipe 92a uses inert gas, such as nitrogen and helium, which has a low oxygen partial pressure. The supplied first gas PG1 preferably contains the vapor of the same material as the liquid LW or the vapor having a composition of the vapor of the evaporating liquid LW. The second gas PG2 supplied from the second gas supply port 92b preferably has an atmosphere, such as air having humidity of 40%, with approximately the same component ratio as the atmosphere (gas) PG3 in the space in which the wafer stage 45 is arranged.

Thus, the first gas PG1 uses inert gas having a low partial pressure of oxygen. As the partial pressure of oxygen contained in the first gas PG1 is lower than that in the second gas PG2, oxygen that decreases the transmittance of the exposure light can be shielded from the liquid LW. The evaporation of the liquid LW can be restrained by adjusting the humidities of the first gas PG1 and the second gas PG2. A measurement error of the distance-measuring apparatus 50 can be restrained by preventing an uneven concentration of the atmosphere in the space in which the wafer stage 45 is arranged.

The convex 100a projects in the wafer direction from the final plane of the projection optical system 30, and is separate from the base 100b of the nozzle unit 100, as described above. The convex 100a forms an interval smaller than the interval between the projection optical system 30 and the wafer 40. Thereby, the convex 100a limits a movement of the liquid LW, and improves the confinement effect of the liquid LW using the gas curtain. A distance is about 1 mm between the final plane of the projection optical system 30 and the wafer 40, whereas a distance h is about 0.4 mm between the convex 100a and the corresponding wafer 40 or the flat-topped plate 46. Since excessive blowing power of the gas curtain (gas PG) could disperse the liquid LW supplied to the space between the projection optical system 30 and the wafer 40, and the upper limit of the blowing power of the gas PG is restricted. Nevertheless, this upper limit is not enough to limit the liquid LW in the aperture of 1 mm, and thus this embodiment makes the interval between the projection optical system 30 and the wafer 40 substantially smaller than 1 mm using the distance h between the convex 100a and the wafer 40 or the flat-topped plate 46, restricting the blowing power drop of the gas PG. This configuration secures the confinement function of the liquid LW using the gas curtain, and prevents contamination of the atmosphere inside and outside the exposure apparatus 1 due to evaporations of the liquid LW, even when the liquid LW uses an organic or inorganic material having a high refractive index.

An excessively small distance h would cause contacts between the convex 100a and the wafer 40 due to the power failure, earthquake, and vibrations. Thus, the exposure apparatus 1 includes an adjusting mechanism 110 that adjusts the distance h between the convex 100a and the wafer 40. The adjusting mechanism 110 attempts to prevent a contact between the convex 100a and the wafer 40, and moves the convex 100a. As shown in FIG. 2, the adjusting mechanism 110 includes a driver 111, a measurement part 113, and a controller 115.

The driver 111 serves to move the convex 100a, and is an extendable bellows (not shown) in this embodiment. The driver 111 movably connects the convex 100a to the nozzle unit 100. The driver 111 moves the convex 100a vertically in cooperation with the driver (not shown). In this case, a stopper (not shown) formed on the convex 100a may restrict a position to which the convex 100a moves. In addition, the liquid LW is likely to leak from the space between the projection optical system 30 and the wafer 40 as the wafer 40 moves for a long distance, for example, during alignment. Thus, during alignment, the distance h should be made small between the convex 100a and the wafer 40. Of course, the distance between the convex 100a and the wafer 40 may be made small at a time other than during alignment.

The measurement part 113 is a distance-measuring sensor that measures an interval or distance between the final lens in the projection optical system 30 and the wafer 40, and arranged in on the nozzle unit 100 or the wafer stage 45, for example. The measurement part 113 sends the measurement result to the controller 115.

The controller 115 controls the driver 111 (a driving unit not shown) based on the measurement result of the measurement part 113 so as to optimize the distance h between the convex 100a and the wafer 40.

As discussed, the exposure apparatus 1 facilitates the gas curtain by the first gas PG1 using the gas curtain by the second gas PG2, realizing the rectifying action through the double gas curtain, and forms a stable gas curtain of the first gas PG1. This configuration can stably limit the liquid LW between the projection optical system 30 and the wafer 40, improving the exposure accuracy. In addition, the exposure apparatus 1 restricts a generation of the evaporation heat using the double gas curtains, and secures high-quality exposure. Moreover, the exposure apparatus 1 can improve the economical efficiency by supplying the gas to and recovering the gas from a location necessary to form the gas curtain.

Figure 5:
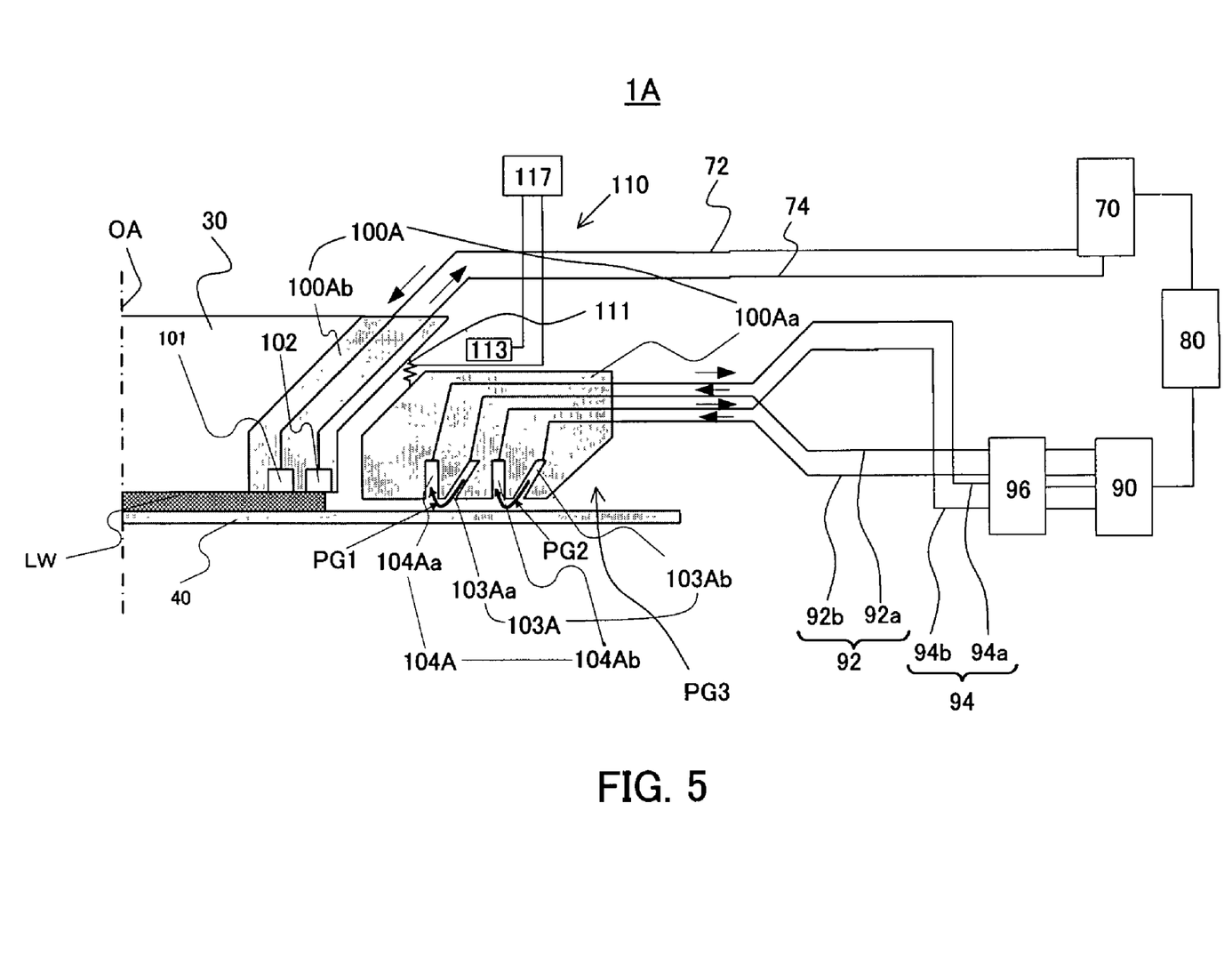
FIG. 5 is an enlarged sectional view near a projection optical system and a wafer in a variation of the exposure apparatus shown in FIG. 1.

Referring now to FIG. 1, a description will be given of an exposure apparatus 1A as a variation of the exposure apparatus 1. The exposure apparatus 1A is similar to the exposure apparatus 1, but different from it in a structure of the nozzle unit 10A. Here, FIG. 5 is a view for explaining the exposure apparatus 1A, and an enlarged sectional view near the projection optical system 30 and the wafer 40 in the exposure apparatus 1A.

Similar to the nozzle unit 100, the nozzle unit 100A has the liquid supply port 101, the liquid recover port 102, the gas supply port 103A and the gas recovery port 104A. The gas supply port 103A and the gas recovery port 104A substantially serve as the gas supply port 102 and the gas recovery port 104. The nozzle unit 100A is different from the nozzle unit 100 in that the nozzle unit 100A exchanges positions of the second gas supply port 103Ab and the second gas recovery port 104Ab. The exposure apparatus 1A uses the nozzle unit 100A with a similar effect to that of the exposure apparatus 1.

The gas supply port 102A is connected to the gas supply pipe 92, and serves as an opening that supplies the first gas PG1 and the second gas PG2. In other words, the gas supply port 102A is an opening that forms the gas curtain, and is formed in the convex 100Aa in the nozzle unit 100A in this embodiment.

The gas recovery port 104A is connected to the gas recovery port 94, and serves as an opening that recovers the supplied gas PG. The gas recovery port 104A is arranged near the gas supply port 102A. The gas recovery port 104A is formed in the gas supply port 102A with respect to the optical axis OA in the projection optical system 30. Thereby, the flow direction of the gas PG directs from the outside to the inside with respect to the optical axis OA of the projection optical system 30.

As described above, when the wafer stage 45 moves at a high speed, or when the contact angle of the liquid LW is low, the liquid LW is drawn and an extension amount of the liquid LW increases. The first gas PG1 supplied from the first gas supply port 103Aa restrains the extending liquid LW, and the first gas recovery port 104Aa recovers the extending liquid LW with the first supplied gas PG1. In that case, the first gas recovery port 104a sucks air and liquid simultaneously, and would cause vibrations. Accordingly, this embodiment separates the convex 100Aa having the first gas recovery port 104Aa (including the second gas recovery port 104Ab) from the base 100Ab of the nozzle unit 100A. The gas supply port 103A has a first gas supply port 103Aa and a second gas supply port 103Ab, and the gas recovery port 104A has a first gas recovery port 104Aa and a second gas recovery port 104Ab.

The first gas supply port 103Aa is arranged outside the liquid supply port 101 with respect to the optical axis OA of the projection optical system 30, and supplies the first gas PG1 around the liquid LW. The second gas supply port 103Ab is arranged outside the first gas supply port 103Aa with respect to the optical axis OA of the projection optical system 30, and supplies the second gas PG2 adjacent to the first gas PG1. The first gas recovery port 104Aa is arranged inside the first gas supply port 103Aa with respect to the optical axis OA of the projection optical system 30, and between the liquid supply port 101 and the first gas supply port 103Aa. The first gas recovery port 104Aa recovers at least the first gas PG1 supplied from the first gas supply port 103a. The second gas recovery port 104Ab is arranged between the first gas supply port 103Aa and the second gas supply port 103Ab, and, and recovers at least the second gas PG2 supplied from the second gas supply port 103Ab. An arrangement between the gas supply port 103A and the gas recovery port 104A reduces the above rectifying action, but provides the humidity control effect.

The first gas supply port 103Aa, the second gas supply port 103Ab, the first gas recovery port 104Aa, and the second gas recovery port 104Ab may be formed by inserting a porous member, such as sponge, or a slit-shaped opening. As described above, in order to improve the economical efficiency, the gas is supplied to and recovered from only a location necessary to form the gas curtain.

As described above, the exposure apparatus 1A restrains a generation of the evaporation heat due to the double gas curtains, realizing a high-quality exposure. In addition, the exposure apparatus 1A can improve the economical efficiency by supplying the gas to and recovering the gas from only a location necessary to form the gas curtain.

In exposure, the light emitted from the light source section 12 illuminates the reticle 20 via the illumination optical system 14. The light that has passed the reticle 20 and contained a reticle pattern is imaged on the wafer 40 via the projection optical system 30 and the liquid LW. The exposure apparatuses 1 or 1A can limit the liquid LW between the projection optical system 30 and the liquid LW without generating the evaporation heat due to the double gas curtains, realizing a high-quality exposure (or high resolution). In addition, the exposure apparatus 1 or 1A supplies the gas only at a location necessary to form the gas curtain, and improves the economical efficiency.

Figure 6:
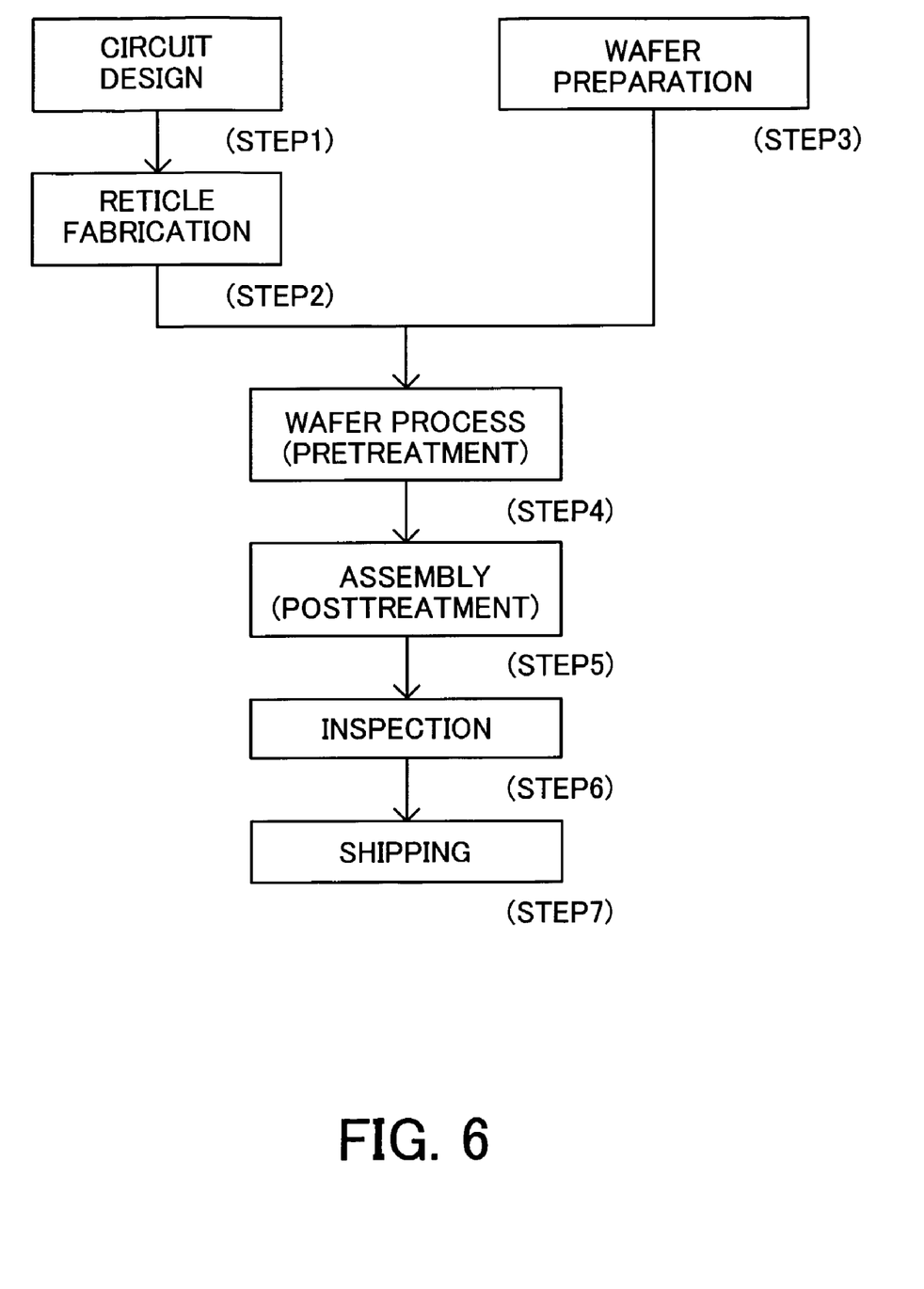
FIG. 6 is a flowchart for explaining a manufacture of a device.
Figure 7:
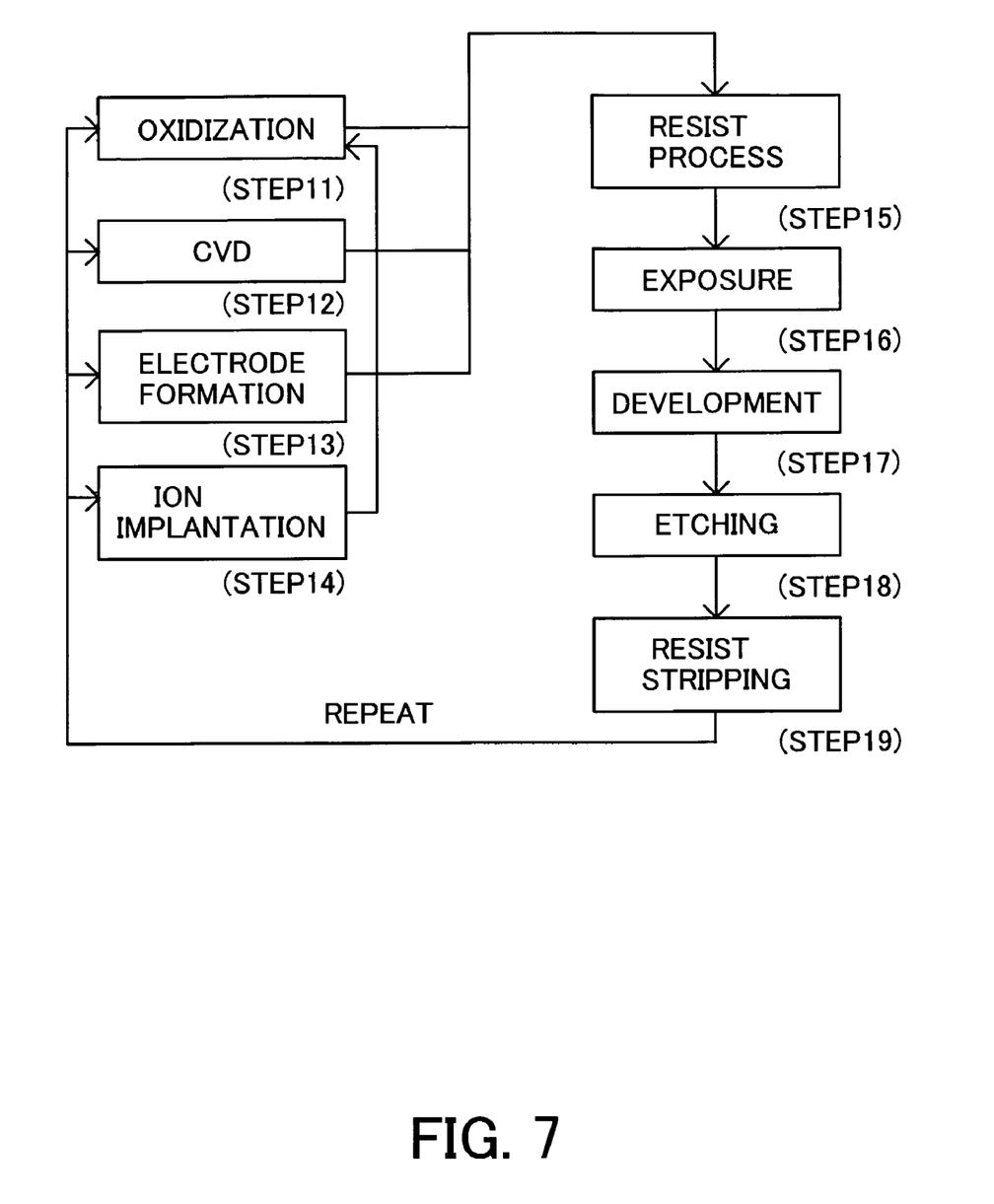
FIG. 7 is a detailed flowchart of a wafer process of step 4 shown in FIG. 6.

Referring now to FIGS. 6 and 7, a description will be given of an embodiment of a device manufacturing method using the exposure apparatuses 1 or 1A. FIG. 6 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms actual circuitry on the wafer through lithography using the reticle and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 7 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatuses 1 or 1A to expose a circuit pattern of the reticle onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. Use of the manufacturing method in this embodiment helps manufacture higher-quality devices than ever. The device manufacturing method that uses the exposure apparatus 1 or 1A and resultant devices constitute one aspect of the present invention.

Further, the present invention is not limited to these preferred embodiments, and various variations and modifications may be made without departing from the scope of the present invention.

This application claims a foreign priority benefit based on Japanese Patent Application No. 2005-302577, filed on Oct. 18, 2005 and Japanese Patent Application No. 2006-219032 filed on Aug. 10, 2006, which is hereby incorporated by reference herein in its entirety as if fully set forth herein.

The invention claimed is:

1. An exposure apparatus comprising:
   a projection optical system for projecting a pattern of a reticle onto a substrate, said exposure apparatus exposing the substrate via a liquid supplied in a space between the projection optical system and the substrate;
   a first gas supply port for supplying a first gas to a circumference of the liquid; and
   a second gas supply port for supplying a second gas different from the first gas, the second gas supply port being arranged outer than the first gas supply port with respect to an optical axis of said projection optical system.

2. An exposure apparatus according to claim 1, further comprising:
   a first gas recovery port for recovering the first gas, the first gas recovery port being arranged inner than the first gas supply port with respect to the optical axis; and
   a second gas recovery port for recovering the second gas, the second gas recovery port being arranged between the first and second gas supply ports.

3. An exposure apparatus according to claim 1, further comprising:
   a first gas recovery port for recovering the first gas, the first gas recovery port being arranged inner than the first gas supply port with respect to the optical axis; and
   a second gas recovery port for recovering the second gas, the second gas recovery port being arranged outside the second gas supply port with respect to the optical axis.

4. An exposure apparatus according to claim 1, wherein the first gas has a composition of a vapor of the same material as the liquid or a vapor of the liquid that evaporates, and
   wherein a concentration of the vapor contained in the first gas is higher than that of the vapor contained in the second gas.

5. An exposure apparatus according to claim 1, wherein a partial pressure of oxygen contained in the first gas is lower than a partial pressure of oxygen contained in the second gas.

6. An exposure apparatus according to claim 1, further comprising a stage for supporting the substrate, wherein the second gas has a composition of an atmosphere of a space in which the stage is arranged.

7. A semiconductor device manufacturing method comprising the steps of:
   exposing a substrate using an exposure apparatus that includes a projection optical system for projecting a pattern of a reticle onto a substrate, a first gas supply port for supplying a first gas to a circumference of the liquid, and a second gas supply port for supplying a second gas different from the first gas, wherein the second gas supply port is arranged outer than the first gas supply port with respect to an optical axis of said projection optical system, and wherein said exposure apparatus exposes the substrate via a liquid supplied in a space between the projection optical system and the substrate; and
   developing the substrate that has been exposed.

8. A semiconductor device manufacturing method as claimed in claim 7, wherein the exposure apparatus used to expose the substrate further includes:
   a first gas recovery port for recovering the first gas, the first gas recovery port being arranged inner than the first gas supply port with respect to the optical axis; and
   a second gas recovery port for recovering the second gas, the second gas recovery port being arranged between the first and second gas supply ports.

9. A semiconductor device manufacturing method as claimed in claim 7, wherein the exposure apparatus used to expose the substrate further includes:

a first gas recovery port for recovering the first gas, the first gas recovery port being arranged inner than the first gas supply port with respect to the optical axis; and a second gas recovery port for recovering the second gas, the second gas recovery port being arranged outside the second gas supply port with respect to the optical axis.

10. A semiconductor device manufacturing method as claimed in claim 7, wherein the first gas has a composition of a vapor of the same material as the liquid or a vapor of the liquid that evaporates, and wherein a concentration of the vapor contained in the first gas is higher than that of the vapor contained in the second gas.

11. A semiconductor device manufacturing method as claimed in claim 7, wherein a partial pressure of oxygen contained in the first gas is lower than a partial pressure of oxygen contained in the second gas.

12. A semiconductor device manufacturing method as claimed in claim 7, wherein the second gas has a composition of an atmosphere of a space in which the stage is arranged.

* * * * *